United States Patent
Hong et al.

(10) Patent No.: US 7,953,192 B2
(45) Date of Patent: May 31, 2011

(54) RECEIVER WITH FAST GAIN CONTROL AND DIGITAL SIGNAL PROCESSING UNIT WITH TRANSIENT SIGNAL COMPENSATION

(75) Inventors: Suk Kyun Hong, Seoul (KR); Jae Ho Ryu, Seoul (KR); Sung Woo Ryu, Seoul (KR)

(73) Assignee: GCT Semiconductor, Inc., San Jose, CA (US)

( * ) Notice: Subject to any disclaimer, the term of this patent is extended or adjusted under 35 U.S.C. 154(b) by 622 days.

(21) Appl. No.: 11/907,960

(22) Filed: Oct. 18, 2007

(65) Prior Publication Data

US 2008/0187078 A1  Aug. 7, 2008

(30) Foreign Application Priority Data

Oct. 19, 2006 (KR) ........................ 10-2006-0101839

(51) Int. Cl.
*H04L 27/08* (2006.01)
(52) U.S. Cl. ........................................ 375/345; 375/150
(58) Field of Classification Search .................. 375/345, 375/150
See application file for complete search history.

(56) References Cited

U.S. PATENT DOCUMENTS 3,875,515 A * 4/1975 Stuart et al. .................... 375/232
2006/0018486 A1 * 1/2006 Neoran et al. ................... 381/63

* cited by examiner

*Primary Examiner* — Chieh M. Fan
*Assistant Examiner* — Freshteh N Aghdam
(74) *Attorney, Agent, or Firm* — Muir Patent Consulting, PLLC

(57) ABSTRACT

Embodiments of the present general inventive concept relate to a transient signal compensator for apparatuses such as a transceiver or receiver used in a wire/wireless communication and/or a digital signal processor that may be used in the receiver and methods thereof. In one embodiment, a receiver can include an amplifier to amplify a received signal, a digital filter to filter a digital signal corresponding to an output signal of the amplifier, where the digital filter is configured to replace a corresponding value (e.g., stored in a memory) for the digital filter with a gain compensated value during a predetermined delay time after a gain of the amplifier is changed (e.g., from a first gain g1 to a different second gain g2). The gain compensated value to compensate for a transient signal (e.g., related to the change from the first gain g1 to the second gain g2).

9 Claims, 10 Drawing Sheets

FIG. 1

(Prior Art)

| PREAMBLE | Header | PAYLOAD | TAIL |
|---|---|---|---|

RECEIVER WITH FAST GAIN CONTROL AND DIGITAL SIGNAL PROCESSING UNIT WITH TRANSIENT SIGNAL COMPENSATION

BACKGROUND OF THE INVENTION

1. Field of the Invention

The present general inventive concept relates to a receiver usable in a wire communication or a wireless communication and a transient signal compensation digital signal processor that may be used in the receiver, and methods thereof.

2. Description of the Related Art

Figure 1:
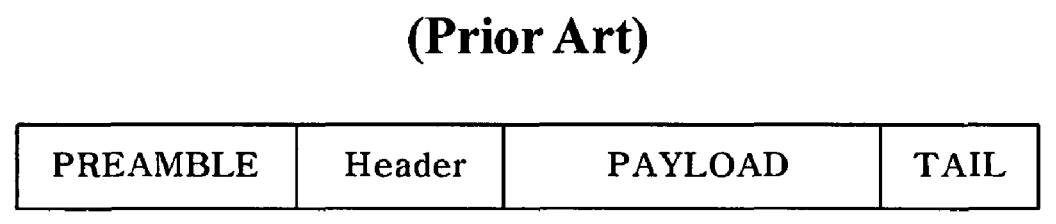

FIG. 1 is a diagram exemplifying a physical layer signal used in a general high speed packet communication. The physical layer signal used in the general high speed packet communication may be divided into four portions including a preamble, a header, a payload and a tail. The preamble is used for estimations required for a receiver to receive the physical layer signal, and the header includes a summary of information on the payload that immediately follows the header. The payload includes an information of an upper layer including a user data that is to be actually transmitted in the high speed packet communication, and the tail is an additional signal for managing different types of impairments that may be generated in a channel such as a CRC (cyclic redundancy check) or ECC (error correction code). Therefore, since three parts other than the payload correspond to an additional signal for transmitting the payload more reliably in the channel where the impairment may exist, the three parts are referred to as an overhead. For example, the overhead is a portion of an entirety of the packet that does not include information of a user. It is preferable that the overhead is minimized, and increasing a ratio of the payload to (preamble+header+payload+tail), which is an effective data transmission index of the packet, is a very important technology object of a high speed packet communication standardization.

The preamble generally occupies the largest part of the overhead. The receiver should estimate a plurality of characteristics of a received signal that passes through a physical channel using the preamble in order to reliably demodulate the signal. A first operation that is generally carried out by the receiver after receiving the preamble is a received power estimation and a reception gain control. A range of a signal strength for an optimized performance exists in an actual receiver. In an analog circuit, the optimized performance is achieved in a predetermined voltage range. A predetermined voltage range should be applied to an ADC (analog-to-digital converter) to secure a quality of a converted signal. In a digital signal processor carrying out a fixed point operation, the optimized performance is achieved in a predetermined number range. Therefore, an accurate reception gain control is very significant in a digital demodulation receiver. The signal having the reception gain thereof controlled is subsequently subjected to multiple operations such as a frequency offset estimation, a channel estimation, a timing recovery and a carrier recovery using the preamble. Generally, since an accuracy of a properly designed estimator increases as an estimation time thereof is longer, a reliable estimation is possible only when an appropriate time is given to each estimation. Therefore, a rapid processing of the reception gain control in a short preamble section is very important in the receiver of the high speed communication.

FIG. 2 is a diagram illustrating an example of a related art closed loop gain control.

The received signal is amplified or attenuated to a proper voltage range by passing through a programmable gain amplifier 10 and then input to an analog filter circuit 11. A signal being outputted from the analog filter circuit 11 is applied to an ADC 13 via a programmable gain amplifier 12. An analog signal is converted to a digital fixed point signal using the ADC 13. The converted signal is applied to a decoder 17 via digital signal processors 14, 15 and 16. A digital filter may be used as the digital signal processors. The decoder 17 decodes the payload to be transmitted to the upper layer. A received power estimator 18 estimates the received power using the signal that passed through the ADC 13 and signals being outputted from the digital signal processors 14, 15 and 16. The received power estimator 18 transmits the estimated received power to a gain controller 19. The gain controller 19 properly adjusts a gain for each stage such that the received power is in a desired range at multiple stages within the ADC 13 and the digital signal processors 14, 15 and 16. Since a new gain is calculated from the received signal having the gain thereof adjusted already, the scheme illustrated in FIG. 2 is called the closed loop gain control.

In accordance with the closed loop gain control, an entire gain control speed is affected by a plurality of factors such as a gain control step size, a power estimation algorithm and a gain settling time. The gain settling time is mostly caused by delay elements of the circuit in case of a properly designed circuit. A settling time of the analog filter 11, a latency of the ADC 13 and a settling time of memories of the digital signal processors 14, 15 and 16 also affect the gain settling time. For example, a time at which values of the memories in the closed loop of a gain control are filled with the received signal having a changed gain applied there to can become the same as the gain settling time. Particularly, since a storing time of the memories of the digital signal processors 14, 15 and 16 may be very long, a minimization of memory elements in the closed loop of the gain control is very important. Therefore, it is a general method to operate the digital signal processor that requires a long memory after a gain settling. For instance, an operation of a frequency shift estimation requires a relatively long memory, which is generally carried out after the gain control.

FIG. 3 is a diagram illustrating an example of the gain settling time in a digital filter wherein (a) illustrates an input signal of the digital filter and (b) illustrates an output signal of the digital filter. When a signal having its gain changed is applied to the digital filter, a distorted signal of an original signal is transmitted from a time at which the signal is applied until a predetermined time later, and an undistorted signal is outputted after the predetermined time. The distorted signal is referred to as a transient signal, and the transient signal is not used for a digital signal processing. Accordingly, digital signal processing is delayed until the transient signal disappears. Therefore, the gain settling time is elongated as a transient signal period gets longer, which prevents a rapid gain control.

The above references are incorporated by reference herein where appropriate for appropriate teachings of additional or alternative details, features and/or technical background.

SUMMARY OF THE INVENTION

An object of embodiments of the application is to solve at least the above problems and/or disadvantages or to provide at least the advantages described herein in whole or in part.

Another object of the application is to provide a receiver and a digital signal processor and methods thereof that reduce or minimize a transient signal period.

It is another object of the application to provide a receiver structure and method that effectively compensates or removes a transient signal to allow other digital signal processings during the gain control or reduce a transient signal period for rapid gain control.

It is yet another object of the application to provide a receiver structure and method that can internally compensate a gain variation of a programmable gain amplifier.

It is yet another object of the application to provide a digital signal processor and method that may be employed by a receiver.

It is another object of the application to provide a digital signal processor and method that reduces or minimizes a transient signal period of the output signal when a gain of an input signal is changed.

It is another object of the application to provide a digital signal processor and method where a transient signal generated when a gain control is carried out according to a received signal power is effectively compensated to simultaneously achieve a rapid gain control and a reduction of a degradation of a reception performance.

To achieve objects of embodiments of the application in whole or in part, there is provided a receiver that can include a programmable gain amplifier to amplify a received signal, an ADC to convert an output signal of the programmable gain amplifier to a digital signal, a digital filter to filter an output signal of the ADC, a received power estimator to estimate a received power from at least one of the output signal of the ADC or an output signal of the digital filter and a gain controller to control a gain of the programmable gain amplifier according to the estimated received power, wherein the digital filter is configured to substitute a value of the digital filter with a gain compensated value for a predetermined delay time after a change in the gain of the programmable gain amplifier.

To achieve objects of embodiments of the application in whole or in part, there is provided an FIR filter that can include a shift register having L storing elements, wherein an input signal is inputted to an input terminal of a first one of the L storing elements, and L is an integer more than one, L first multiplying units where an $M^{th}$ one of the L first multiplying units is connected between an output terminal of $M^{th}$ one of the L storing elements and an input terminal of $(M+1)^{th}$ one of the L storing elements, M being an integer equal or more than one and less than L and $L^{th}$ one of the L first multiplying units is connected to an output terminal of $L^{th}$ one of the L storing elements, a plurality of second multiplying units for multiplying a plurality of predetermined coefficients to output signals of the L first multiplying units and the input signal and an adder for adding output signals of the plurality of second multiplying units.

To achieve objects of embodiments of the application in whole or in part, there is provided a digital signal processor that can include a transient signal compensator to substitute at least one past value of an input signal with a gain compensated value when a gain of the input signal is changed and an operating circuit for subjecting the at least one past value to an operation.

To achieve objects of embodiments of the application in whole or in part, there is provided a method for processing a digital signal that can include generating at least one past value by storing a digital input signal, subjecting the at least one past value and the digital input signal to an operation and controlling the at least one past value to be a gain compensated value when a gain of the digital input signal is changed, wherein the gain compensated value is based on gain values before and after the gain change.

BRIEF DESCRIPTION OF THE DRAWINGS

These and/or other aspects and utilities of the present general inventive concept will become apparent and more readily appreciated from the following description of embodiments of the present general inventive taken in conjunction with the accompanying drawings of which:

FIG. 1 is a diagram exemplifying a physical layer signal used in a packet communication.

DETAILED DESCRIPTION OF EMBODIMENTS

Figure 2:
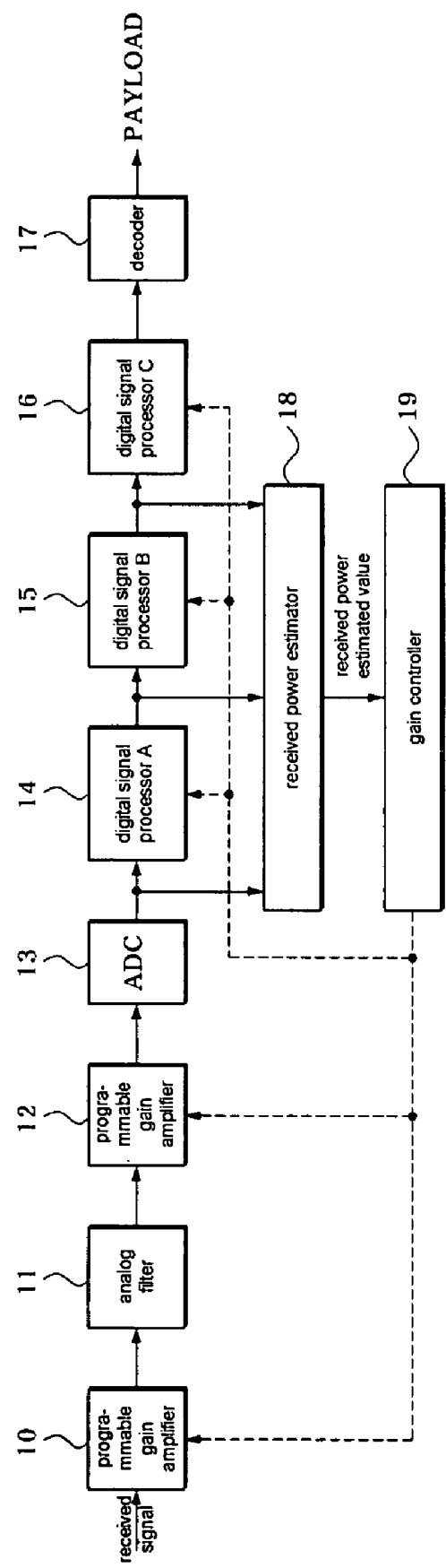
FIG. 2 is a diagram illustrating an example of a closed loop gain control.
Figure 3:
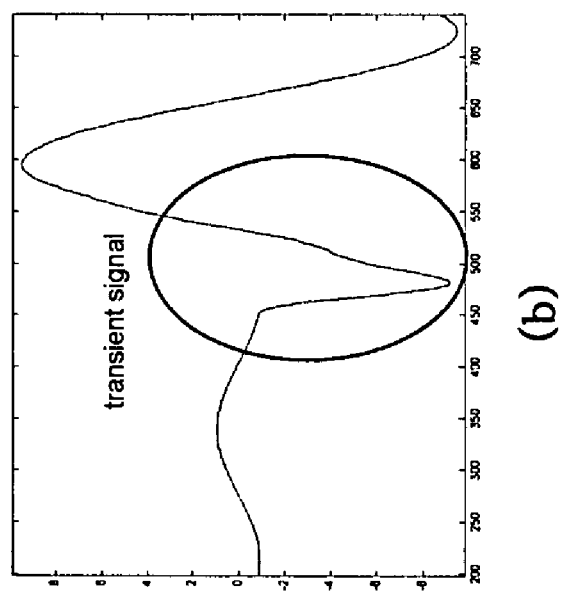
FIG. 3 is a diagram illustrating an example of a gain stabilizing time in a digital filter.
Figure 3:
Figure 3:
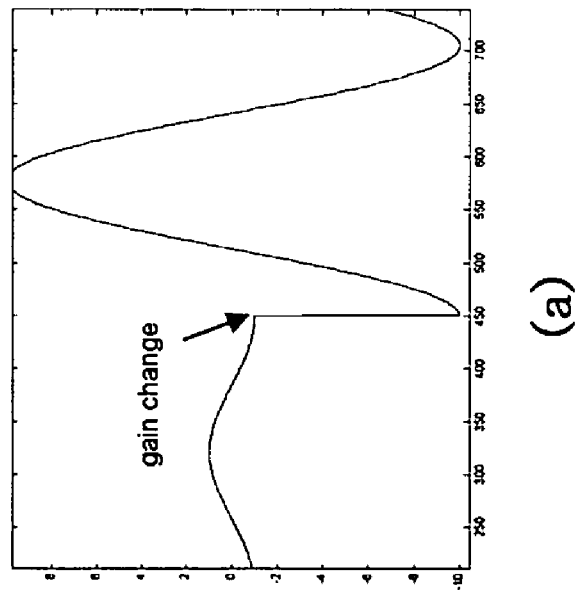

Reference will now be made to exemplary embodiments of the application, examples of which are illustrated in the accompanying drawings, wherein like reference numerals refer to the like elements throughout. The interpretations of the terms and wordings used in description and claims should not be limited to common or literal meanings. The exemplary embodiments are described below in order to explain the present general inventive concept by referring to the figures.

Figure 4:
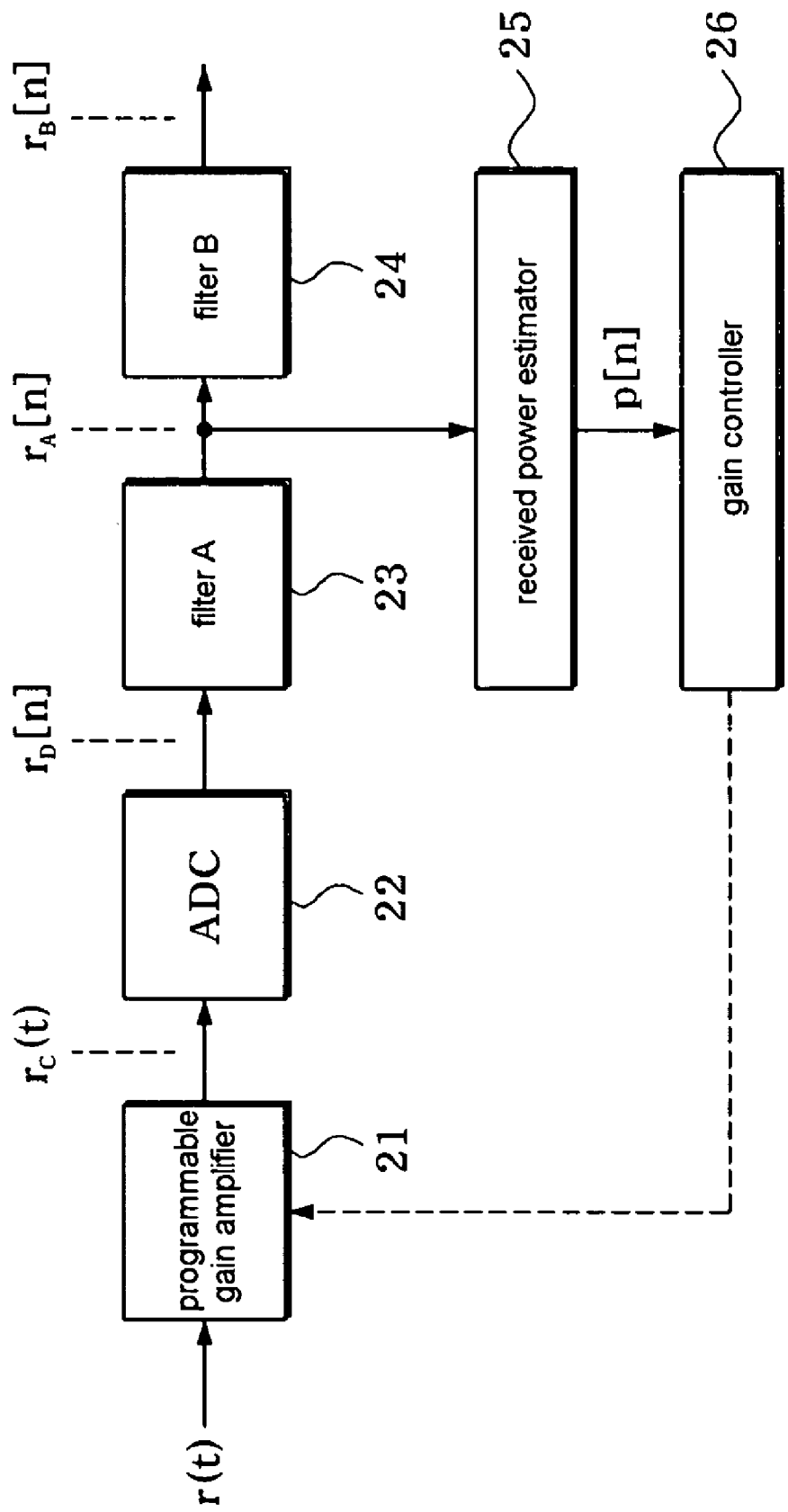
FIG. 4 is a diagram illustrating an example of a closed loop gain control.

FIG. 4 is a diagram illustrating an example of a closed loop gain control according to the application.

As shown in FIG. 4, a received signal can be applied to an ADC 22 through a programmable gain amplifier 21, and the received signal is applied to a digital filter B 24 and a power estimator 25 after passing through the ADC 22 and a digital signal filter A 23. The digital signal filter A 23 and the power estimator 25 are an example of a digital signal processor having a memory included in a closed loop, which may vary. The digital filter B 24 is an example of the digital signal processor of a post-closed loop, which may vary. The power estimator 25 is an example of a moving average of a length P, which may vary.

Operations of each block of FIG. 4 may be represented as mathematical equations below. For example, when a received analog signal is r(t) an output $r_C(t)$ of the programmable gain amplifier 21 may be expressed as equation 1, an output $r_D[n]$ of the ADC 22 as equation 2, an output $r_A[n]$ of the digital signal filter A 23 as equation 3, an output $r_B[n]$ of the digital filter B 24 as equation 4, and an output p[n] of the power estimator 25 as equation 5.

$$r_C(t) = r(t)g(t) \qquad \text{[Equation 1]}$$

$$\begin{aligned} r_D(n) &= r_C(t - dT_S) \\ &= r(t - dT_S)g(t - dT_S) \\ &= r[n-d]g[n-d] \end{aligned} \qquad \text{[Equation 2]}$$

-continued $$r_A[n] = \sum_{k=0}^{A-1} r_D[n-k]h_A[k] \quad \text{[Equation 3]}$$

$$= \sum_{k=0}^{A-1} r[n-d-k]g[n-d-k]h_A[k]$$

$$r_B[n] = \sum_{k=0}^{B-1} r_A[n-k]h_B[k] \quad \text{[Equation 4]}$$

$$p[n] = \sum_{k=0}^{P-1} |r_A[n-k]|^2, \quad \text{[Equation 5]}$$

where $T_S$ is a sampling time interval of the ADC 22, g(t) is a gain of the programmable gain amplifier 21, d $T_S$ is a latency of the ADC 22 (d preferably being an integer), $h_A[n]$ is an impulse response of the digital signal filter A 23, A is a length of the impulse response of the digital signal filter A 23, $h_B[n]$ is an impulse response of the digital filter B 24, and B is a length of the impulse response of the digital filter B 24.

When the gain of the programmable gain amplifier 21 is adjusted from $g_1$ to $g_2$ at a given moment, i.e. at $n_1 T_S$, operations of each block may be represented as equations below. For example, the output of the programmable gain amplifier 21 may be expressed as equation 6, the output of the digital signal filter A 23 as equation 7, and a transient signal $r_r[n]$ generated due to the gain adjustment of equation 7 as equation 8.

$$r_C(t) = \begin{cases} g_1 r(t), & t < n_1 T_S \\ g_2 r(t), & t \geq n_1 T_S \end{cases} \quad \text{[Equation 6]}$$

$$r_A[n] = \quad \text{[Equation 7]}$$

$$\begin{cases} g_1 \sum_{k=0}^{A-1} r[n-d-k]h_A[k], & n < n_1 + d \\ g_2 \sum_{k=0}^{A-1} r[n-d-k] \\ \quad h_A[k] + r_T[n], & n_1 + d \leq n < n_1 + d + A - 1 \\ g_2 \sum_{k=0}^{A-1} r[n-d-k]h_A[k], & n \geq n_1 + d + A - 1 \end{cases}$$

$$r_T[n] = (g_1 - g_2) \sum_{k=n-n_1-d+1}^{A-1} r[n-d-k]h_A[k] \quad \text{[Equation 8]}$$

The transient signal of the digital signal filter A 23 expressed in equation 8 can be generated at an interval of $n_1 + d \leq n < n_1 + d + A - 1$. The transient signal is then applied to the digital filter B 24 and the power estimator 25, and accordingly, can generate the transient signal in these two blocks. Since the digital filter B 24 has a transient signal interval of $n_1 + d \leq n < n_1 + d + A + B - 1$, and the power estimator 25 has a transient signal interval of $n_1 + d \leq n < n_1 + d + A + P - 1$, the transient signal is elongated by a memory length of each of signal processing blocks in the digital signal filter A 23, which increases as the signal processing block increases. Therefore, an operation of other or subsequent signal processing blocks is generally initiated after a received gain adjustment is complete.

Figure 5:
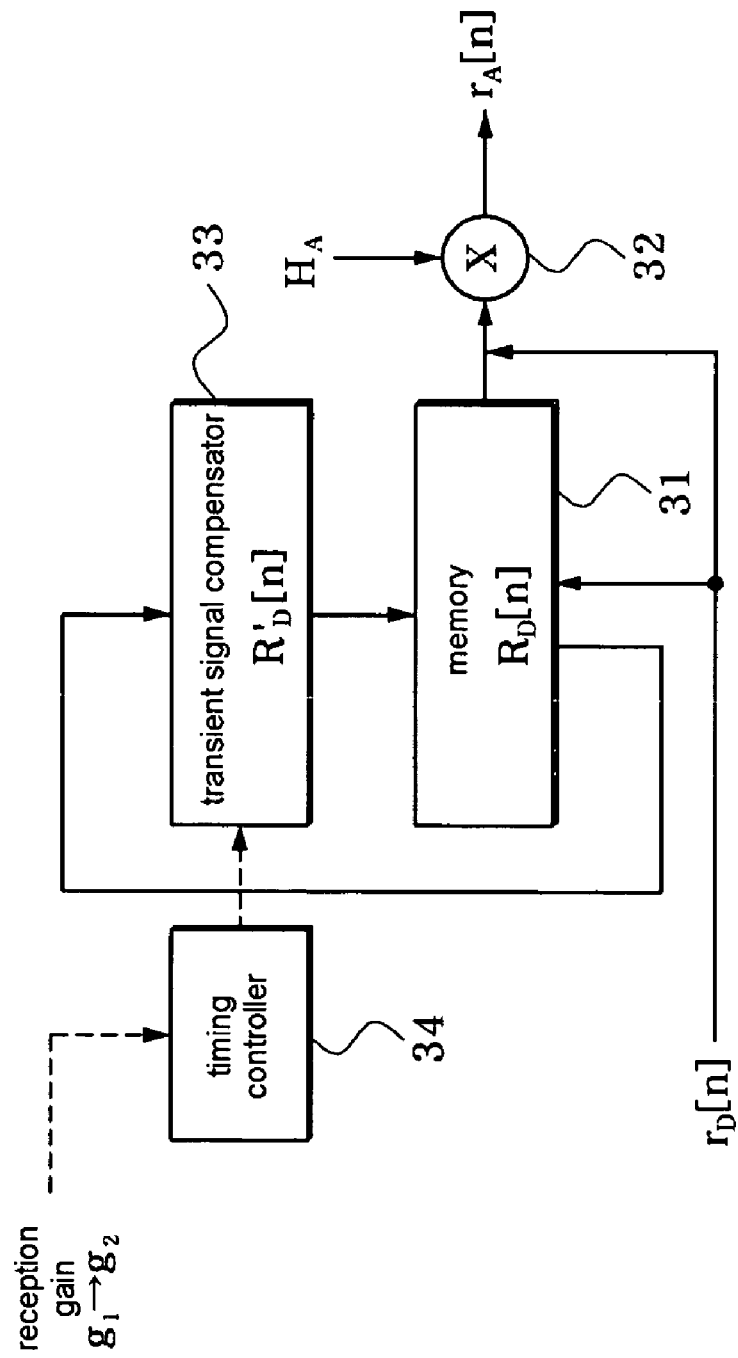
FIG. 5 is a diagram illustrating a digital signal processor capable of a transient signal compensation in accordance with an embodiment of the application, a digital filter A having a function of the transient signal compensation.

FIG. 5 is a diagram illustrating a digital signal processor capable of a transient signal compensation in accordance with an embodiment of the present application. As shown in FIG. 5, a digital filter A can have a function of the transient signal compensation.

A memory 31 and a vector multiplier 32 are included in a related art digital filter A.

The memory 31 stores a past value of the signal $r_D[n]$ being inputted to the digital filter A. In accordance with the embodiment of FIG. 5, since the length of the impulse response of the digital filter A is A, the memory 31 preferably stores a total of A−1 past values $r_D[n-1], r_D[n-2], \ldots, r_D[n-A+1]$. The past values of $r_D[n]$ stored in the memory 31 are referred to as a memory vector $R_D[n]$. $R_D[n]$ is equal to $\{r_D[n-1], r_D[n-2], \ldots, r_D[n-A+1]\}$.

The vector multiplier 32, which is a type of an operating means, can output a signal $r_A[n]$ obtained by multiplying the memory vector $R_D[n]$ and the input signal $r_D[n]$ by an impulse response vector $H_A$. The impulse response vector $H_A$ is represented as $\{h_A[A-1], h_A[A-2], \ldots, h_A[0]\}$. Therefore, the signal $r_A[n]$ being outputted from the vector multiplier 32 can be represented as $\{r_D[n], r_D[n-1], \ldots, r_D[n-A+1]\}\{h_A[A-1], h_A[A-2], \ldots, h_A[0]\}^T$, i.e. $(r_D[n]h_A[A-1]+r_D[n-1]h_A[A-2]+ \ldots +r_D[n-A+1]h_A[0])$.

A transient signal compensator 33 can compensate the transient signal according to a variation of the gain. A compensation operation of the transient signal compensator 33 may be expressed as equation 9.

$$R'_D[n] = \begin{cases} R_D[n], & n < n_1 + d \\ \frac{g_2}{g_1} R_D[n], & n = n_1 + d \\ R_D[n], & n > n_1 + d \end{cases} \quad \text{[Equation 9]}$$

Operations according to equation 9 represents that the memory vector can be substituted with a gain compensated value according to a timing $n=n_1+d$. The compensation operation of the transient signal of equation 9 changes the output of the digital filter A, which may be expressed as equation 10

$$r_A[n] = \begin{cases} g_1 \sum_{k=0}^{A-1} r[n-d-k]h_A[k], & n < n_1 + d \\ g_2 \sum_{k=0}^{A-1} r[n-d-k]h_A[k], & n \geq n_1 + d \end{cases} \quad \text{[Equation 10]}$$

As expressed in equation 10, the gain of the output signal of the digital filter A can be changed from $g_1$ to $g_2$ after an ADC latency d without the transient signal. Since the output of the digital filter A is compensated to be without the transient signal, an output signal without the transient signal having the gain $g_2$ applied thereto may be obtained for the block when a compensation method according to the present application is applied to the digital filter B and the power estimator.

The digital filter A may further include a timing controller 34. The timing controller 34 can control the transient signal compensator 33 in a manner that the transient signal compensator 33 may substitute the memory vector with the gain compensated value at the timing $n=n_1+d$. For example, the timing controller 34 can provide, to the transient signal compensator 33, a ratio $g_2/g_1$ at the timing to the gain. The timing controller 34 may be included in each of the digital filters in the gain controller or the like.

The above-described transient signal compensation may be applied to the digital filter B and the received power estimator.

Figure 6:
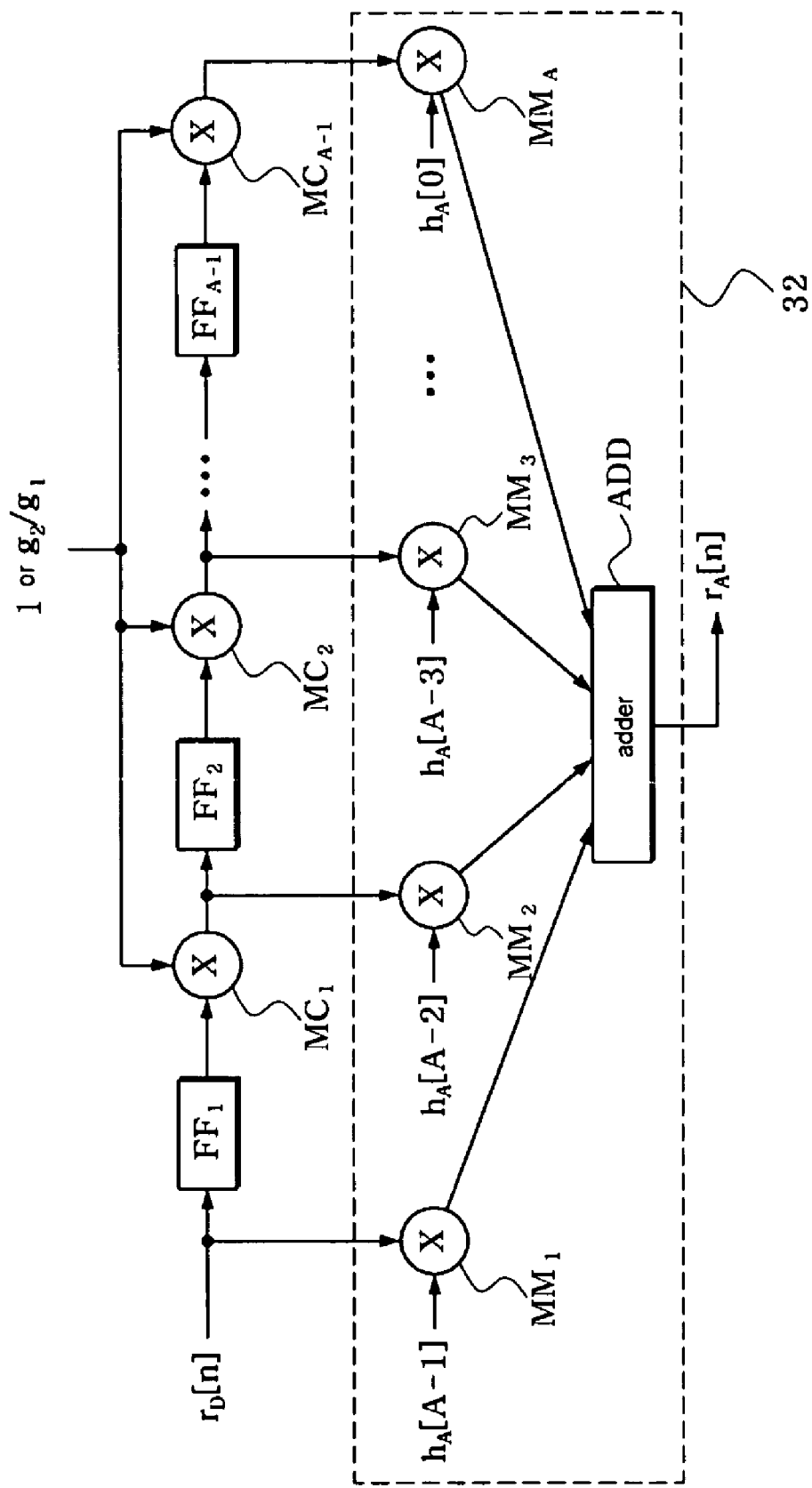
FIG. 6 is a diagram illustrating an example of an FIR (finite impulse response) filter in accordance with an embodiment of the application.

FIG. 6 is a diagram illustrating an example embodiment where transient signal compensation is applied to an FIR (finite impulse response) filter according to the present application.

As illustrated in to FIG. 6, the FIR filter can include a number of (A−1) storage elements $FF_1$, $FF_2$, ..., and $FF_{A-1}$, a number (A−1) first multipliers $MC_1$, $MC_2$, ... and $MC_{A-1}$, a number of A second multipliers $MM_1$, $MM_2$, ... and $MM_A$ and an adder ADD.

The number of (A−1) storage elements $FF_1$, $FF_2$, ... and $FF_{A-1}$ can correspond to the memory 31 of FIG. 5. For example, each of the storage elements may be embodied using a flip-flop. If the first multipliers $MC_1$, $MC_2$, ... and $MC_{A-1}$ for the transient signal compensation do not exist, the storage elements $FF_1$, $FF_2$, ... and $FF_{A-1}$ may be connected in serial to forward the input signal $r_D[n]$. Therefore, the number of (A−1) storage elements $FF_1$, $FF_2$, ... and $FF_{A-1}$ may be simply referred to shift registers.

The number of A second multipliers $MM_1$, $MM_2$, ... and $MM_A$ and the adder ADD can correspond to the vector multiplier 32 shown in FIG. 5. In an actual embodiment, it is known by one skilled in the art that the vector multiplier 32 may be simpler than shown, for example, when the impulse response is symmetric. Therefore, a detailed description thereof is omitted here. In addition, it is also known by one skilled in the art the multipliers $MM_1$, $MM_2$, ... and $MM_A$ may be carried out by a simple logic operation when $H_A$ has a fixed value. Therefore, a detailed description thereof is omitted here.

The number of (A−1) first multipliers $MC_1$, $MC_2$, ... and $MC_{A-1}$ can correspond to the transient signal compensator 33 of FIG. 5. The first multipliers $MC_1$, $MC_2$, ... and $MC_{A-1}$ preferably multiplies 1 to an input when $n \neq n_1+d$, and multiplies $g_2/g_1$ when $n=n_1+d$. The first multipliers $MC_1$, $MC_2$, ... and $MC_{A-1}$ can be controlled by the timing controller 34 of FIG. 5. In order to reduce a size of a hardware, the first multipliers $MC_1$, $MC_2$, ... and $MC_{A-1}$ may be embodied in a manner that the first multipliers $MC_1$, $MC_2$, ... and $MC_{A-1}$ carry out only a shift operation. In this example, the first multipliers $MC_1$, $MC_2$, ... and $MC_{A-1}$ carry out only a multiplication corresponding to $2^k$ (where k is an integer). As illustrated in FIG. 6, one of the first multipliers $MC_1$, $MC_2$, ... and $MC_{A-1}$ is connected to an output terminal of the last storage element $FF_{A-1}$ of the storage elements $FF_1$, $FF_2$, ... and $FF_{A-1}$, and a rest of the first multipliers $MC_1$, $MC_2$, ... and $MC_{A-1}$ are serially connected between two of the storage elements $FF_1$, $FF_2$, ... and $FF_{A-1}$.

Operations of the FIR filter shown in FIG. 6 will now be described. Since a case of $n \neq n_1+d$ is identical to that of the first multipliers $MC_1$, $MC_2$, ... and $MC_{A-1}$ being not existent, for example, since an output of the first storage element $FF_1$ is directly inputted to the second storage element $FF_2$ and an output of the second storage element $FF_2$ is directly inputted to the third storage element $FF_3$, the FIR filter in FIG. 6 can operate similar to a general FIR filter without the transient signal compensation. In case of $n=n_1+d$, the output of the storage elements $FF_1$, $FF_2$, ... and $FF_{A-1}$ is a signal having a prior gain, e.g. the gain of $g_1$ while the input $r_D[n]$ of the filter is the signal having the gain thereof controlled, e.g. to be the gain of $g_2$. However, the first multipliers $MC_1$, $MC_2$, ... and $MC_{A-1}$ are connected to the output of the storage elements $FF_1$, $FF_2$, ... and $FF_{A-1}$, and the multipliers $MC_1$, $MC_2$, ... and $MC_{A-1}$ can multiply $g_2/g_1$ to the inputs thereof. Therefore, the signal inputted to the vector multiplier 32 is a signal having a gain thereof controlled, preferably to a signal having the gain of $g_2$. In addition, the signals stored in the memory device after $n=n_1+d$ are the signals having the gain of $g_2$. The filter shown in FIG. 6 operates as described above to compensate for the transient signal. Since the type of digital filter carrying out the moving average may be easily obtained by removing the second multipliers $MM_1$, $MM_2$, ... and $MM_{A-1}$ that carry out the vector multiplication, a detailed description of the filter that carries out the moving average is omitted here.

Figure 7:
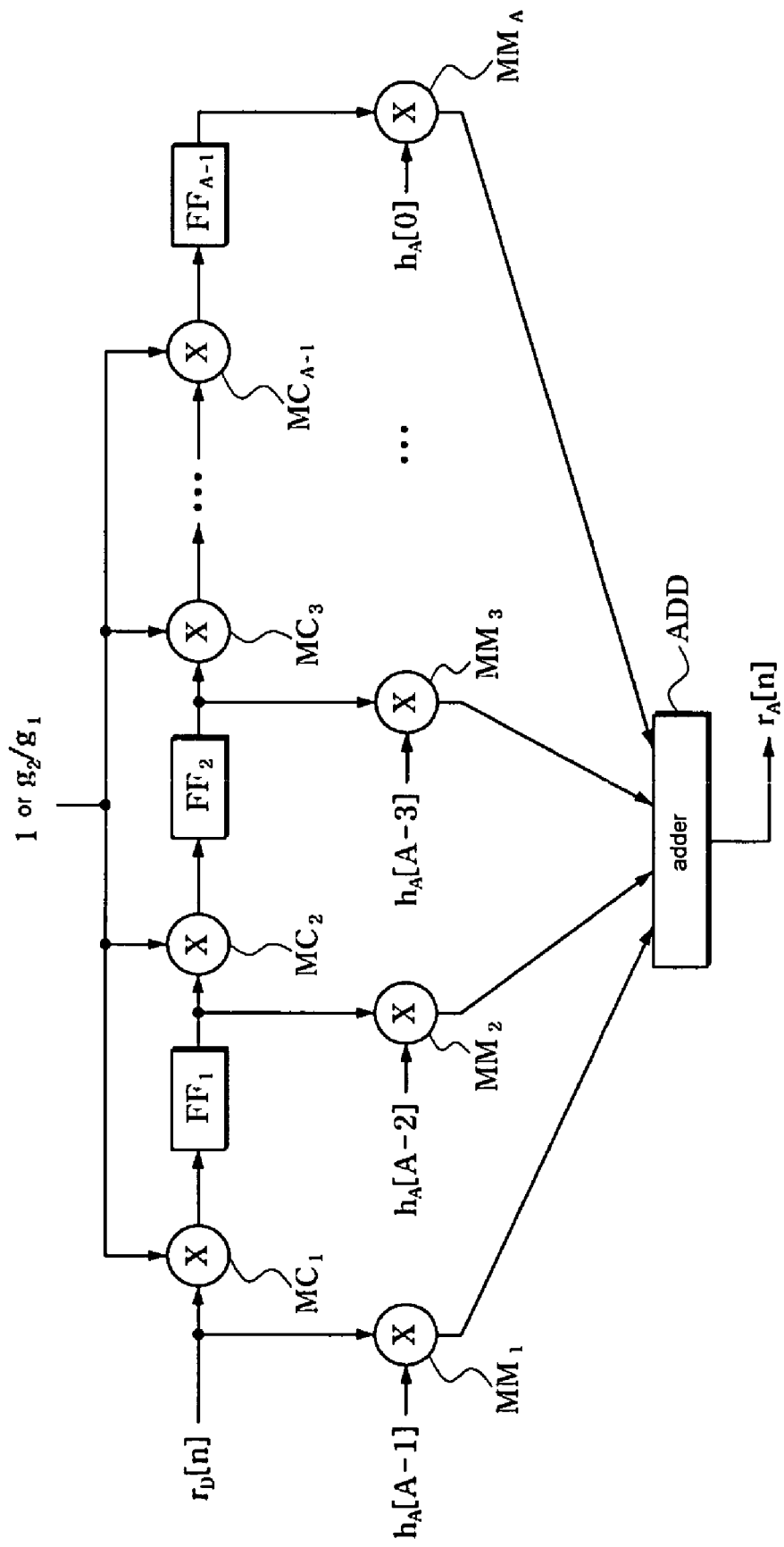
FIG. 7 is a diagram illustrating a variation of a FIR filter in accordance with an embodiment of the application.

FIG. 7 is a diagram illustrating another example embodiment of a digital filter of FIG. 5 having a transient signal compensation function according to the present application applied to an FIR filter. The digital filter of FIG. 7 will be described using the embodiment of FIG. 5, however the present general inventive concept is not intended to be limited thereby.

When compared to FIG. 6, the example of FIG. 7 differs from that of FIG. 6 in that the first multipliers $MC_1$, $MC_2$, ... and $MC_{A-1}$ are moved to a front of the storage elements $FF_1$, $FF_2$, ... and $FF_{A-1}$ corresponding to the transient signal compensator 33 of FIG. 5. Since the first multipliers $MC_1$, $MC_2$, ... and $MC_{A-1}$ are moved to the front, the first multipliers $MC_1$, $MC_2$, ... and $MC_{A-1}$ multiplies 1 to the input when $n=n_1+d-1$, and multiplies $g_2/g_1$ to the input when $n \neq n_1+d-1$.

Figure 8:
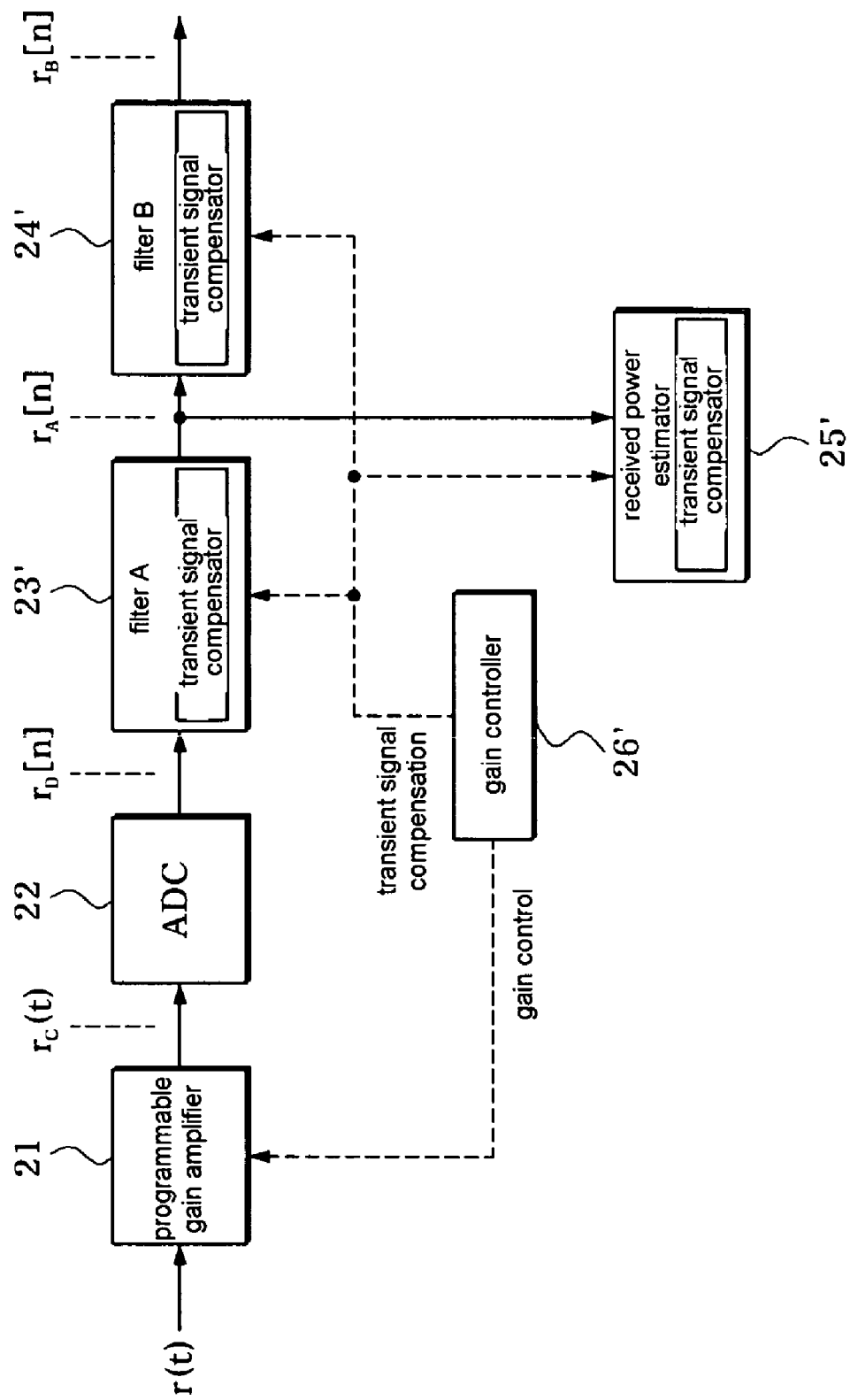
FIG. 8 is a diagram illustrating a receiver in accordance with an embodiment of the application.

FIG. 8 is a diagram illustrating a receiver in accordance with an embodiment of the present application.

As illustrated in FIG. 8, the receiver can include a programmable gain amplifier 21, an ADC 22, a digital filter A 23', a digital filter B 24', a received power estimator 25' and a gain controller 26'. While the receiver may further include components carrying out various functions such as a decoder (not shown) and a channel estimator (not shown) or the like, only portions directly related to the present application are shown.

The programmable gain amplifier 21 amplifies an input signal r(t) being inputted to the receiver and outputs the amplified signal. A gain of the programmable gain amplifier 21 is controlled by gain controller 26'.

The ADC 22 converts an analog signal $r_C(t)$ being outputted from the programmable gain amplifier 21 to a digital signal $r_D[n]$.

The digital filter A 23' can filter the signal $r_D[n]$ being outputted from the ADC 22 to output a signal $r_A[n]$. The digital filter A 23' can include a transient signal compensator according to embodiments of the present application. For example, the digital filter A' can include transient signal compensator as illustrated in FIGS. 5 through 7. In order to achieve this, the digital filter A 23' can be controlled by gain controller 26'. As described above, for example, the digital filter A 23' can substitute a value stored in a memory disposed within the digital filter A 23' with a gain compensated value when the gain of the programmable gain amplifier 21 is changed and a predetermined delay time needs to elapse to compensate for the transient signal. The predetermined delay time preferably corresponds to a delay time between the programmable gain amplifier 21 and the digital filter A 23'.

The digital filter B 24' can filter the signal $r_A[n]$ being outputted from the digital filter A 23' and output a filtered signal $r_B[n]$. The digital filter B 24' can include the transient signal compensator as illustrated in FIGS. 5 through 7, and is controlled by gain controller 26'.

The received power estimator 25' can estimate a received power from the signal the output signal $r_A[n]$ of the digital filter A 23' and provide an estimated received power p[n] to gain controller 26'. The received power estimator 25' can be a digital filter for obtaining the moving average, for instance, and include the transient signal compensator. The received power estimator 25' can be controlled by gain controller 26'. Alternatively, in another embodiment, the received power estimator 25' may estimate the received power from the output signal $r_D[n]$ of the ADC 22 or the output signal $r_B[n]$ of the digital filter B 24'.

The variable gain amplifier 26 can control the gain of the programmable gain amplifier 21 according to the estimated received power p[n] output by the received power estimator 25'. In addition, gain controller 26' can control the digital filter A 23', the digital filter B 24' and the received power estimator 25' in a manner that the transient signal can be reduced or compensated when the gain of the programmable gain amplifier 21 is changed.

The receiver shown in FIG. 8 can operate as described above to reduce or remove the transient signal of the digital filter B 24' and the received power estimator 25' and reduce the settling time.

In accordance with above-described embodiments of a transient signal compensation apparatus and method, difficulties can occur when an operation of $R'_D[n]$ of equation 9 is actually embodied. A first difficulty is that a multiplication operation of multiplying the gain $g_2/g_1$ to the memory vector $R_D[n]$ is required. A second difficulty is that the gain $g_2/g_1$ should be accurately calculated by compensating for a variation of the gain of the programmable gain amplifier that is embodied using an analog circuit. In order to address or solve the two problems, two methods described below may be employed.

In accordance with the first method, the multiplication operation of the memory vector may be simplified by allowing only $g_2/g_1$ to be $2^k$ (where k is an integer) such that the multiplication operation becomes the shift operation. In addition, since the operation of $2^k$ may be embodied to have a relatively small deviation even in case of an analog programmable gain amplifier, the accuracy of the $g_2/g_1$ is increased. The first method is disadvantageous in that the gain adjustment should be carried out by a unit of 6 dB. Generally, the gain adjustment of less than 6 dB is required in some cases, and a resolution of the ADC is not fully used when the gain is controlled by the unit of 6 dB, which can result in a waste of the resolution of 1 bit in a worst case.

Figure 9:
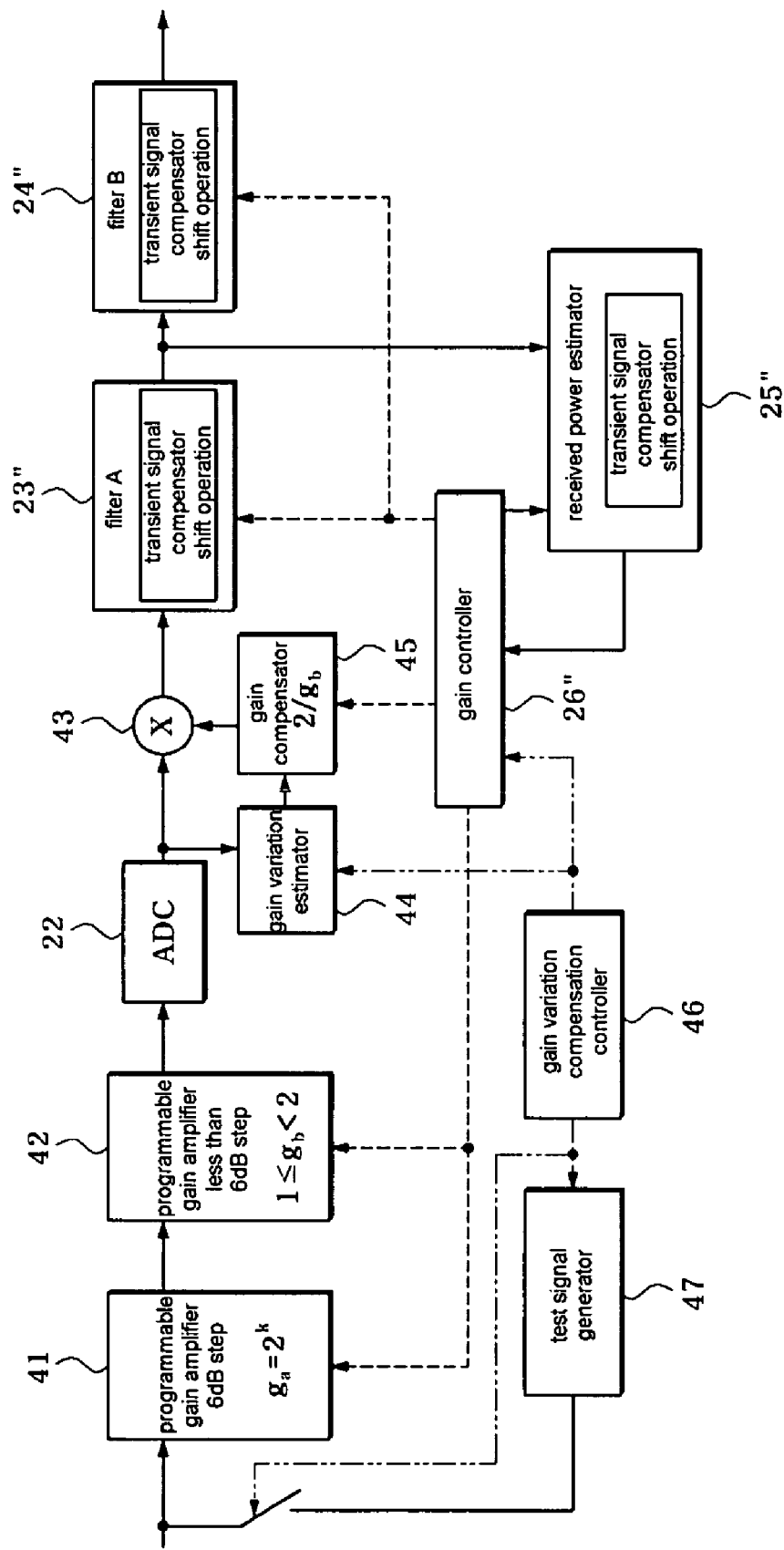
FIG. 9 is a diagram illustrating a receiver in accordance with another embodiment of the application.

The second method that can address or overcome the above problem is shown in FIG. 9.

As shown in FIG. 9, the programmable gain amplifier can include a first programmable gain amplifier 41 wherein the gain thereof is controlled by tale unit of 6 dB and a second programmable gain amplifier 42 wherein the gain thereof is controlled by the unit of less than 6 dB. For example, the gain of the first programmable gain amplifier 41 corresponds to $2^k$ (where k is the integer), and the gain of the second programmable gain amplifier 42 is controlled such that the gain is equal to or more than 1 and less than 2 (equal to or more than 0 dB and less than 6 dB).

The transient signal compensation of the first programmable gain amplifier 41 may be carried out by the first method. For example, the transient signal compensation of the first programmable gain amplifier 41 may be carried out by the transient signal compensator (wherein the multiplication is embodied by a simple shift operation) that carries out the shift operation disposed within the digital signal processor such as a digital filter A 23", a digital filter B 24" and a received power estimator 25".

On the contrary, since a gain $g_b$ by the second programmable gain amplifier 42 may be maintained to have a value of 2 (e.g., a constant value) when $2/g_b$ is multiplied according to a delay time d of the ADC 22, a separate gain compensation according to $g_b$ is not required. For this, the receiver further can include a gain compensator 45 for multiplying $2/g_b$ and a multiplier 43 for outputting a signal obtained by multiplying $2/g_b$ being outputted from the gain compensator 45 to the output signal $r_D[n]$ of the ADC to the digital filter A 23".

In addition, in order to obtain a more accurate $2/g_b$, the receiver further can include a test signal generator 47, a gain variation estimator 44 and a gain variation compensation controller 46. The test signal generator 47 inputs a test signal to an input terminal of the first programmable gain amplifier 41, and the gain variation estimator 44 receives an output of the ADC 22 and estimates a gain variation of the second programmable gain amplifier 42 and controls the gain compensator 45 in a manner that the gain compensator 45 outputs the accurate $2/g_b$ to the multiplier 43. The gain variation compensation controller 46 can control the test signal generator 47, the second programmable gain amplifier 42 and the gain variation estimator 44 in a manner that a gain of the second programmable gain amplifier 42 is varied so as for the gain variation estimator 44 to estimate the gain variation while the output of the test signal generator 47 is inputted to the input terminal of the first programmable gain amplifier 41.

Figure 10:
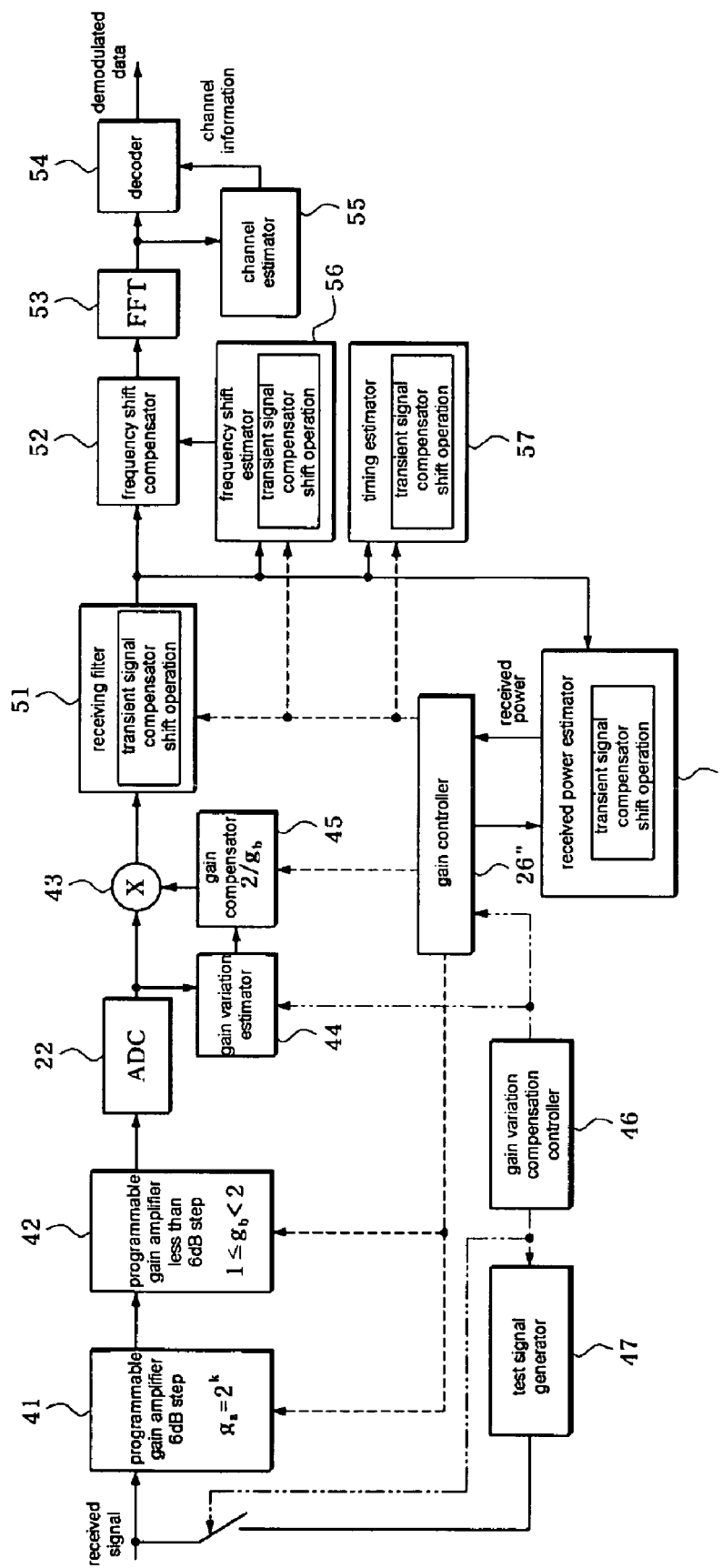
FIG. 10 is a diagram illustrating an OFDM receiver in accordance with an embodiment of the application.

FIG. 10 is a diagram illustrating an embodiment of an OFDM receiver to which the present general inventive concept is applied. The OFDM receiver shown in FIG. 10 can include a first programmable gain amplifier 41, a second programmable gain amplifier 42, an ADC 22, a gain variation estimator 44, a gain compensator 45, a multiplier 43, a receiving filter 51, a frequency shift compensator 52, a FFT (Fast Fourier Transform) 53, a decoder 54, a channel estimator 55, a frequency shift compensator 56, a timing estimator 57, a received power estimator 25", a gain controller 26", a gain variation compensation controller 46 and a test signal generator 47.

Contrary to a related art OFDM receiver, the OFDM receiver shown in FIG. 10 may carry out a gain control and an estimation operation such as a frequency shift estimation and a timing estimation simultaneously by including the transient signal compensator according to the application in the digital signal processors 51, 56, 57 and 25".

The present general inventive concept may be applied to various digital demodulation receiver structures in addition to the OFDM receiver.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments. Furthermore, for ease of understanding, certain method procedures may have been delineated as separate procedures; however, these separately delineated procedures should not be construed as necessarily order dependent in their performance. That is, some procedures may be able to be performed in an alternative ordering, simultaneously, etc.

As described above, embodiments of digital signal processors, filters, receivers and methods for the same in accordance with the application have various advantageous. For example, transient signal periods can be reduced or minimized to for the rapid gain control according to embodiments of the application.

In addition, receiver embodiments in accordance with the application are advantageous in that the transient signal is effectively compensated or removed to allow other digital signal processings during the gain control.

Moreover, receiver embodiments in accordance with the application can digitally compensate gain variation of a programmable gain amplifier.

In addition, the digital signal processor and the digital filter in accordance with the embodiments of the application are advantageous in that the digital signal processor and the digital filter and methods thereof may be employed by a receiver according to the application.

Moreover, the digital signal processor and the digital filter in accordance with the application are advantageous in that the transient signal period of the output signal is reduced or minimized when the gain of the input signal is changed.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art. As used in this disclosure, the term "preferably" is non-exclusive and means "preferably, but not limited to." Terms in the claims should be given their broadest interpretation consistent with the general inventive concept as set forth in this description. For example, the terms "coupled" and "connect" (and derivations thereof) are used to connote both direct and indirect connections/couplings. As another example, "having" and "including", derivatives thereof and similar transitional terms or phrases are used synonymously with "comprising" (i.e., all are considered "open ended" terms)—only the phrases "consisting of" and "consisting essentially of" should be considered as "close ended". Claims are not intended to be interpreted under 112 sixth paragraph unless the phrase "means for" and an associated function appear in a claim and the claim fails to recite sufficient structure to perform such function.

What is claimed is:

1. A receiver comprising:
    a programmable gain amplifier configured to amplify a received signal, the programmable gain amplifier comprising:
        a first programmable gain amplifier to vary a gain thereof by a first prescribed value; and
        a second programmable gain amplifier to vary a gain of a signal from the first programmable gain amplifier by a second prescribed value;
    an ADC configured to convert an output signal of the programmable gain amplifier to a digital signal;
    a digital filter configured to filter an output signal of the ADC;
    a received power estimator configured to estimate a received power from at least one of the output signal of the ADC or an output signal of the digital filter; and
    a gain controller configured to control a gain of the programmable gain amplifier according to the estimated received power,
    wherein the digital filter is configured to substitute a value of the digital filter with a gain compensated value for a predetermined delay time after a change in the gain of the programmable gain amplifier,
    the receiver further comprising a multiplier coupled between the ADC and the digital filter to multiply a reciprocal of the gain of the second programmable gain amplifier.

2. The receiver in accordance with claim 1, wherein the value of the digital filter is a first filtered value stored in a memory disposed in the digital filter and the predetermined delay time is a delay time between the programmable gain amplifier and the digital filter.

3. The receiver in accordance with claim 1, wherein the gain compensated value is configured to be a second gain/a first gain ratio of the value of the digital filter, the first gain to be a value of the gain prior to the gain change and the second gain to be a value of the gain after the gain change.

4. The receiver in accordance with claim 1, wherein the received power estimator is configured to substitute a value of the received power estimator with another gain compensated value for a second predetermined delay time corresponding to a delay time between the programmable gain amplifier and the received power estimator after the gain is changed.

5. The receiver in accordance with claim 4, wherein the another gain compensated value of the received power estimator is configured to combine the value stored in the received power estimator and a second gain divided by a first gain, the first gain being a value of the gain prior to the change of the gain and the second gain being a value of the gain after the change of the gain.

6. The receiver in accordance with claim 1, wherein a ratio of a first gain to a second gain is $2^k$, the first gain being a gain prior to the change of the gain, the second gain being a gain after the change of the gain, the k being an integer, and the substitution is configured to be a shift operation.

7. The receiver in accordance with claim 1, wherein the first prescribed value is multiple of 6 dB, wherein the second prescribed value is between 0 dB and 6 dB, and wherein the substitution is carried out by a shift operation.

8. The receiver in accordance with claim 1, further comprising:
    a test signal generator configured to input a test signal to an input terminal of the programmable gain amplifier;
    a gain variation estimator configured to receive the output of the ADC and to estimate a gain variation of the second programmable gain amplifier, and to control the multiplier to compensate the gain variation; and
    a gain variation compensation controller configured to control the test signal generator, the second programmable gain amplifier and the gain variation estimator configured to vary the gain of the second programmable gain amplifier while an output of the test signal generator is input to the input terminal of the first programmable gain amplifier for the gain variation estimator to estimate the gain variation.

9. The receiver in accordance with claim 1, wherein the digital filter is an FIR filter comprising:
    a plurality of L storing elements configured to receive an input signal;
    a plurality of L first multiplying means for multiplying received signals, wherein at least one of the L first multiplying means is coupled between an output terminal and an input terminal of subsequent one of the L storing elements;
    a plurality of second multiplying means for multiplying a plurality of predetermined coefficients and to output signals; and
    an adder to add output signals of the plurality of second multiplying means.

* * * * *